United States Patent [19]
Lee

[11] Patent Number: 5,808,274
[45] Date of Patent: Sep. 15, 1998

[54] METHOD OF CUTTING MASKING SHEET TO BE USED TO PROCESS SILICON WAFER

[75] Inventor: Masahiro Lee, Obu, Japan

[73] Assignee: Teikoku Taping System Co., Ltd., Tokai, Japan

[21] Appl. No.: 684,006

[22] Filed: Jul. 19, 1996

[30]  Foreign Application Priority Data

Jul. 15, 1996 [JP] Japan .................................. 8-205416

[51] Int. Cl.$^6$ .............................................. B23K 26/02
[52] U.S. Cl. .............................. 219/121.72; 219/121.83; 219/121.85
[58] Field of Search ..................... 219/121.67, 121.68, 219/121.69, 121.72, 121.78, 121.81, 121.83, 121.85, 121.73; 264/400; 156/248, 250, 267, 272.8

[56]  References Cited

U.S. PATENT DOCUMENTS

| | | | |
|---|---|---|---|
| 4,443,684 | 4/1984 | Sakuragi et al. | 219/121.68 |
| 4,522,679 | 6/1985 | Funakoshi et al. | 156/267 X |
| 4,568,407 | 2/1986 | Barbieri et al. | 156/510 |
| 4,584,455 | 4/1986 | Tomizawa | 219/121.68 |
| 4,779,497 | 10/1988 | Lee | 83/16 |
| 4,832,444 | 5/1989 | Takahashi et al. | 385/117 |
| 4,851,061 | 7/1989 | Sorkoram | 219/121.67 X |
| 4,865,677 | 9/1989 | Matsushita et al. | 156/248 X |
| 4,910,377 | 3/1990 | Matsutani et al. | 219/121.68 X |
| 4,925,515 | 5/1990 | Yoshimura et al. | 156/250 |
| 4,998,005 | 3/1991 | Rathi et al. | 219/121.83 |
| 5,168,141 | 12/1992 | Tashijan et al. | 219/121.83 X |

FOREIGN PATENT DOCUMENTS

| | | | |
|---|---|---|---|
| 58-168488 | 10/1983 | Japan | 219/121.83 |
| 60-86292 | 5/1985 | Japan . | |
| 61-284926 | 12/1986 | Japan . | |
| 62-144890 | 6/1987 | Japan . | |
| 3-107317 | 5/1991 | Japan . | |
| 4-261900 | 9/1992 | Japan . | |
| 6-270099 | 9/1994 | Japan . | |
| 7-241688 | 9/1995 | Japan . | |
| 91/04828 | 4/1991 | WIPO | 219/121.73 |

*Primary Examiner*—Gregory L. Mills
*Attorney, Agent, or Firm*—Morgan, Lewis & Bockius LLP

[57]  ABSTRACT

A method of cutting away the unnecessary portions of a masking sheet bonded to a silicon wafer during the IC manufacturing process. The method uses a laser cutting device which includes an optical fiber containing silver halide and a CCD camera to control the position of the laser focal point.

4 Claims, 4 Drawing Sheets

METHOD OF CUTTING MASKING SHEET TO BE USED TO PROCESS SILICON WAFER

BACKGROUND OF THE INVENTION

1. Field of the Invention

The present invention relates to a method of automatically cutting along the periphery of the silicon wafer a masking sheet bonded to a surface of a silicon wafer on which an integrated circuit (IC), a large scale integrated circuit (LSI) or a very large scale integrated circuit (VLSI). That is, this method is utilized in a process to be performed before a lapping process and a polishing process, or a back surface-grinding process, and after a slicing process of slicing the silicon wafer formed in a crystallizing process in an IC manufacturing process.

2. Description of the Prior Art

The IC manufacturing process can be divided into a crystallizing process, a pre-process of a wafer-forming process, a post-process of the wafer-forming process, an assembling process, and an inspection process. The crystallizing process comprises a slicing operation to be performed after the growth of Si crystal; and a lapping operation and a polishing operation or a back surface-grinding operation. The lapping operation is performed to remove most of a strained layer from the surface of the wafer formed in the slicing operation, to reduce the thickness of the wafer to a predetermined one, and lap the surface thereof to a mirror-like surface finish with a considerable degree of accuracy in the roughness and evenness of the surface on which a circuit is formed.

It has become necessary to develop techniques of producing a thin wafer to comply with demands for the production of a thin and compact product including an IC formed; facilitate the mounting of the IC on a package having a limited space; and solve the problem of heat generated by the wafer. Thus, it is increasingly performed that not only the lapping operation is preferred in the crystallizing process, but also the lapping operation or the back surface-grinding operation is performed in the post-process of the wafer-forming process. That is, in the lapping operation to be carried out in the crystallizing process, the surface of the wafer on which a circuit is formed is lapped while in the lapping operation to be performed in the post-process of the wafer-forming process, the back surface of the wafer is lapped.

Even in the case of a CMOS which generates a small amount of heat, it is necessary to lap the wafer to a high degree if a package is small.

In the lapping operation to be performed in the post-process of the wafer-forming process, a masking sheet, for example, a laminate is bonded to the upper surface of the wafer, and the upper surface of the wafer is fixedly sucked to an internal gear-mounted table to lap the back surface of the wafer. The masking sheet is bonded to the upper surface of the wafer to protect the wafer from being damaged by a cutting blade or the like in the lapping operation and the etching operation or the back surface-grinding process. The masking sheet-bonding operation is performed manually.

In the masking sheet-bonding operation, a sheet having an area a little larger than that of the upper surface of the wafer is bonded to the upper surface of the wafer. Thereafter, the masking sheet is cut to remove the peripheral portion thereof positioned outside the periphery of the wafer completely from the portion of the masking sheet bonded to the wafer. This operation is performed also manually.

PROBLEMS TO BE SOLVED BY THE INVENTION

A skilled operator performs this operation. Thus, much time and labor are required and further, the operation is inefficiently performed.

In the cutting operation, the masking sheet is cut with a cutting blade with the cutting blade kept to be in contact with the periphery of the wafer. Therefore, even the skilled operator applies an uneven pressure to the periphery of the wafer. Thus, there is a possibility that the edge of the wafer is chipped and chips are generated. Further, the circuit formed on the wafer may be cut by mistake during the cutting operation.

That is, it takes much time to perform the operation of cutting the masking sheet and removing the waste peripheral portion thereof from the wafer and the yield of the wafer is unfavorable.

Further, an ends (namely whiskers) is left at the periphery of the wafer when the masking sheet is cut. In this case, in a subsequent lapping operation, a cutting blade may be brought into contact with the whiskers, thus damaging a very expensive wafer or a cutter made of diamond of a lapping device.

In order to solve the above-described problems, a method of cutting the masking sheet and removing the waste peripheral portion thereof from the wafer is proposed in Laid-Open Japanese Patent Publication No. Sho 61-284926. In this method, the masking sheet is automatically bonded to the upper surface of the wafer, and the peripheral portion of the masking sheet is automatically removed from the wafer. In this method, a conducted wire is brought into contact with the periphery of the wafer to cut off the peripheral portion of the masking sheet from the portion thereof bonded to the wafer, whereas an unconducted wire is used to remove from the wafer the peripheral portion of the masking sheet (outer sheet portion) and a lump of the waste sheet left in the periphery of the wafer as a result of heating of the masking sheet.

This method is not different from the conventional method in that the masking sheet is cut by bringing the conducted wire into contact with the periphery of the wafer.

Thus, this method has a possibility that the wire is caught by damaged or chipped portions present at the periphery of the wafer, thus breaking the wafer.

Further, linear portion or cutouts which are called as "positioning flat" are marked in the periphery of the wafer. Thus, there is a possibility that the wire is caught by corners of the positioning linear lines or cutouts and hence the wafer is damaged.

In order to overcome these problems, in this method, a sensor is provided to detect the positioning flat or cutouts and damaged or chipped portions of the wafer to stop the cutting/removing device before the wire is caught thereby. But this method is incapable of solving the problems basically.

The following points make it difficult to automate the operation of cutting the masking sheet and removing the peripheral portion thereof from the portion thereof bonded to the wafer from the wafer:

(1) Depending on lots, there is a variation of ±0.5 mm in the diameters of wafers with respect to a reference value.

(2) The positioning linear lines or cutouts which are called as positioning flat are marked in the periphery of the wafer. Thus, there is a possibility that a cutting blade is caught by corners of the positioning linear lines or cutouts and consequently, the wafer is damaged. The number of the positioning flats is one or two, depending on the kind of IC and wafer sizes.

(3) Damaged or chipped portions are considerably formed at the periphery of the wafer before the masking sheet is bonded to the upper surface of the wafer, thus causing the cutting blade to be caught thereby. Consequently, the wafer is broken.

(4) Preferably, the masking sheet is cut along the periphery of the wafer. That is, the above-described problems can be overcome by spacing the cutting blade or the conducted wire at a certain distance apart from the periphery of the wafer in cutting the masking sheet. In this cutting method, after the peripheral portion of the masking sheet is removed from the wafer, a size of the masking sheet bonded to the wafer is larger than a size of the wafer. This method deteriorates the yield.

A laser may be used as a noncontact cutting method. But splash is generated by the influence of energy density and oscillation Q-switching in cutting a resin sheet by laser. The splash is a phenomenon similar to a kind of explosion of resin as a result of rapid local heating of the resin sheet. When the laser is used in cutting the masking sheet bonded to the wafer, the cut face of the masking sheet is uneven and the cleanability of environment is deteriorated due to the splash.

SUMMARY OF THE INVENTION

The present invention has been developed to solve the above-described problems. It is accordingly an object of the present invention to provide a method capable of reliably cutting a masking sheet along the periphery of a silicon wafer to remove a peripheral portion of the masking sheet bonded to the silicon wafer from the silicon wafer.

In the method according to a first aspect of the present invention, a unnecessary portion of the masking sheet for protection of a silicon wafer, which is a peripheral portion of a silicon wafer, bonded to a silicon wafer, is removed from the silicon wafer, by means of laser beams and a recognizing device comprising an optical camera. Therefore, this invention can make capable a complete non-contact cutting method.

The method according to a second aspect of the present invention comprises the steps of oscillating laser beams by a laser beam oscillator; feeding the laser beams to a nozzle through an optical fiber comprising silver halide; condensing the laser beams by a lens through the nozzle; controlling a position of the nozzle by means of a positioning means to control a focal point of the condensed laser beams; and cutting the masking sheet along a periphery of the silicon wafer to remove a peripheral portion of the masking sheet bonded to the silicon wafer from the silicon wafer.

In the method according to a third aspect of the present invention relating to the second aspect, in cutting the masking sheet bonded to the silicon wafer along the periphery of the silicon wafer to remove the peripheral portion of the masking sheet bonded to the silicon wafer from the silicon wafer, the focal point of the condensed laser beams is controlled based on information provided by a CCD camera which recognizes a configuration of the silicon wafer and the focal point of the condensed laser beams.

According to the method of cutting the masking sheet of the present invention, the masking sheet bonded to the silicon wafer can be reliably cut along the periphery of the silicon wafer.

Accordingly, the automated operation of cutting the masking sheet allows it to be cut at a high speed, labor to be saved; the equipment to be intensive. Moreover, because dust or smoke is not generated, the cleanability of the work environment is not deteriorated. Further, the improvement of product quality enables the possibility of occurrence of accidents to be reduced in processes subsequent to the masking sheet-cutting process.

The above-described method of automating the masking sheet-cutting operation and waste sheet-removing operation has the following effects.

(1) The method allows the processing speed to he high and is applicable to silicon wafers of various diameters and configurations, thus improving productivity dramatically, greatly reducing personal expenses, and increasing the yield of the silicon wafer (chip) to almost 100%.

(2) The cutting method of the present invention utilizing laser beams emitted by the $CO_2$ laser does not generate dust in a clean room in which a lapping operation is performed. Therefore, chips are not damaged and the wafer and the tape are heated to a minimum degree. Thus, when the masking sheet bonded to the masking sheet is cut, little smoke is generated.

(3) Further, an expensive cutting blade of a lapping device or that of a device for grinding the back surface of the silicon wafer is allowed to be durable.

Furthermore, according to the method of the present invention, the protection tape can be bonded to the silicon wafer and can be cut, and an unnecessary portion thereof, namely, the peripheral portion thereof can be separated from the silicon wafer without cracking or chipping the silicon wafer, without contact between a cutting blade or the like and the silicon wafer, even though the silicon wafer has defects at the periphery thereof or an unfavorable configuration. Accordingly, if it is necessary to process the silicon wafer again because of a demand for making the silicon wafer thinner or because the silicon wafer has not been processed at a high degree of accuracy or has defects, the protection tape can be bonded to the silicon wafer, cut, and the unnecessary portion thereof can be removed from the silicon wafer safely and many times.

DETAILED DESCRIPTION OF THE INVENTION

Figure 1:
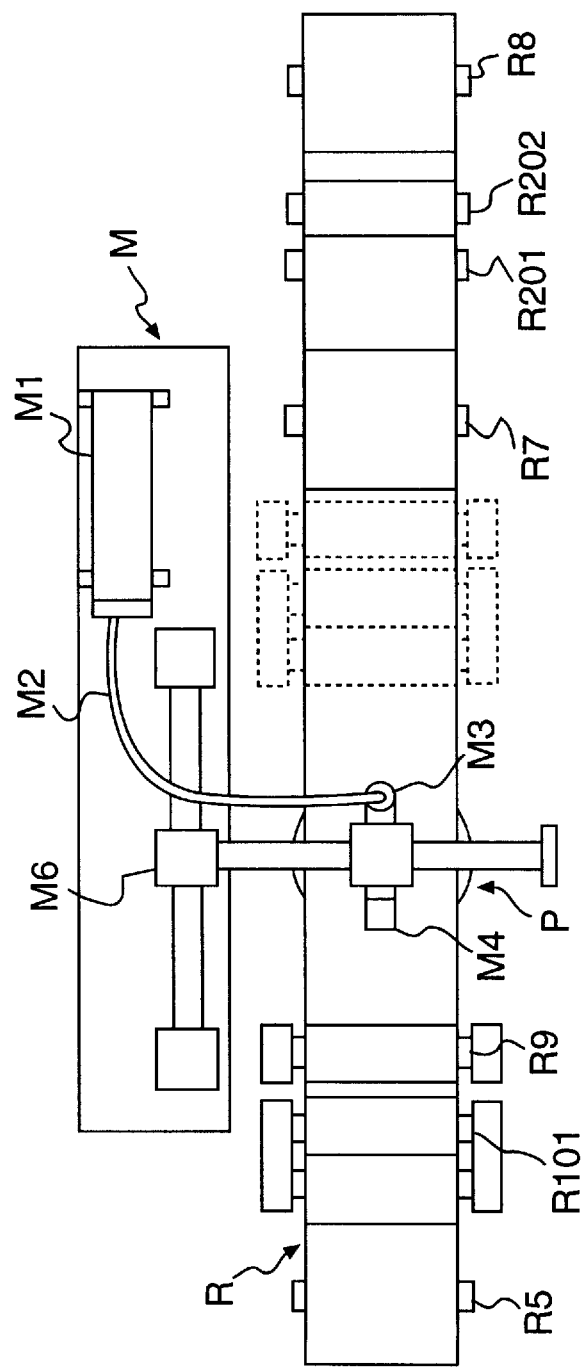
FIG. 1 is a plan view showing a masking sheet-bonding/cutting apparatus.

The optical fiber comprising silver halide according to the present invention comprises a high-purity quartz positioned at the core thereof and silver halide positioned at the cladding portion thereof.

In the method of cutting a masking sheet, as described above, the outer sheet portion of the masking sheet is cut by laser beams. Thus, the masking sheet can be cut reliably along the periphery of the silicon wafer and the peripheral portion thereof bonded to the upper surface of the silicon wafer can be removed reliably from the silicon wafer without contact between the silicon wafer and a cutting blade or the like.

Carbon dioxide ($CO_2$) laser is used in the present invention. The $CO_2$ laser emits a laser beam having a great electric power of several watts to tens of kilowatts.

Further, according to the present invention, the laser beam is fed to a nozzle, the position of which is controlled to control the position of the condensed-laser beam. Therefore, although the apparatus of the present invention has a simple construction, the position of the laser beam can be controlled with a high degree of accuracy, regardless of the size of the laser beam oscillator or the weight thereof.

According to the present invention, the optical fiber comprising silver halide disperses the intensity distribution of the spectrum of the laser beam. This is because the intensity distribution of the spectrum is leveled when the laser beam is reflected by silver halide. Accordingly, splash of resin does not occur in cutting a resinous sheet by the laser beam, unlike in the conventional method.

Further, the laser beam is fed to the nozzle through the optical fiber, thereafter the laser beam is condensed. And the laser beam can be fed by the optical fiber because the energy density of the laser beam is low in the optical fiber.

When the $CO_2$ laser providing a high output is used, preferably, an FC grade optical fiber is used to feed the laser beam. The FC grade optical fiber has a high transmittance and is flexible.

In the method of cutting the masking sheet according to the third aspect of the present invention, a CCD camera recognizes the configuration of the silicon wafer and the focal point of the condensed laser beam. Therefore, the focal point of the condensed laser beam is controlled to cut the masking sheet correctly to separate the peripheral portion thereof from the portion thereof bonded to the silicon wafer, along the periphery of the silicon wafer without contact between the periphery of the silicon wafer and a cutting blade or the like.

The CCD camera to be used in the present invention may be replaced with another optical instruments or an optical camera, so long as they can take the image of an object optically.

As described above, in the method of the present invention of cutting the masking sheet along the periphery of the silicon wafer and removing the outer sheet portion thereof separated from the portion thereof bonded to the silicon wafer from the silicon wafer, the following method is adopted: In order to prevent an unrequested external pressure from being applied to the periphery of the silicon wafer; prevent the cut surface of the silicon wafer from becoming irregular; and prevent whiskers or the like from being left at the periphery of the silicon wafer; and accomplishing the cutting operation favorably even though there are chipped portions at the periphery thereof, the tape is fed out from a tape bobbin at a low speed by applying an appropriate tension to the tape and forming an appropriate angle between the silicon wafer and the tape, by the tape being locally heated with the laser beam emitted by the $CO_2$ laser. In this manner, the masking sheet can be cut reliably by means of the heat of the laser beam. In order to reliably separate a small lump or chips of the waste portion of the masking sheet generated by cutting and heating it, the following methods are adopted: The optical fiber is used to disperse the intensity distribution of the spectrum of the laser beam to overcome the generation of splash due to the influence of the energy density and the oscillation Q-switching in cutting the masking sheet. In addition, the separation roller having an appropriate tension separates cut-off waste sheet from the wafer, with the separation roller forming an appropriate angle with the silicon wafer.

As described above, the laser beam emitted by the $CO_2$ laser is utilized to automatically cut the masking sheet along the periphery of the silicon wafer without contact between a cutting blade or the like and the periphery of the silicon wafer, unlike in the conventional method.

DESCRIPTION OF THE PREFERRED EMBODIMENTS

The method of cutting a masking sheet to be used to process silicon wafer according to an embodiment of the present invention will be described below with reference to drawings.

(First Embodiment)

A tape bonding/cutting apparatus to carry out the method of the present invention according to a first embodiment of the present invention will be described below with reference to FIGS. 1 and 2.

In the tape bonding/cutting apparatus, a masking sheet is bonded to a silicon wafer and the peripheral portion of the bonded masking sheet is removed from the silicon wafer, along the periphery of the silicon wafer. The masking sheet is in the form of a rolled tape having adhesive agent applied thereto and a protection separator attached thereto so that the masking sheet can be handled easily and automatically bonded to the silicon wafer.

(1) Construction of tape bonding/cutting apparatus

Figure 2:
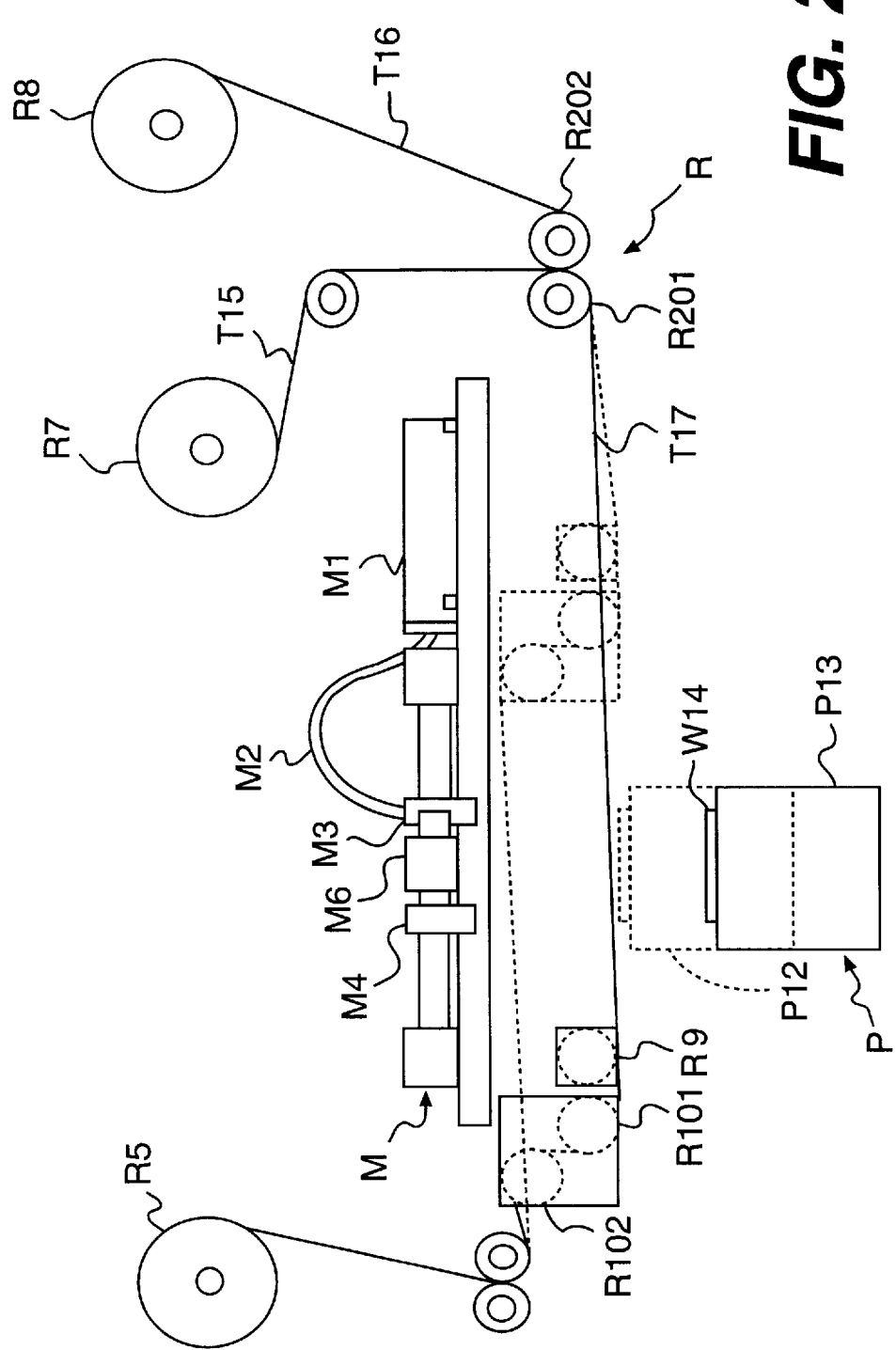
FIG. 2 is a side view showing a masking sheet-bonding/cutting apparatus.

As shown in FIGS. 1 and 2, the tape bonding/cutting apparatus comprises a tape cutting device M; a tape bonding/feeding device R; and a wafer-supporting work table P.

The cutting device M comprises a $CO_2$ laser unit body (hereinafter referred to as "laser unit") M1; an FC grade optical fiber unit (hereinafter referred to as "optical fiber unit") M2; a focus-variable type ZnFe condenser lens (hereinafter referred to as "ZnFe lens") M3; an XY robot of equal speed continuous locus control type (hereinafter referred to as "XY robot") M6; and a CCD camera M4.

One end of the optical fiber unit M2 is connected with the laser unit M1, while the other end thereof is connected with the ZnFe lens M3. The ZnFe lens M3 is installed on the XY robot M6 which controls the focal point of the ZnFe lens M3. The CCD camera M4 and the ZnFe lens M3 are also installed on the XY robot M6. Because the $CO_2$ laser M1 is adopted in the embodiment, the cutting device M is compact and yet provides a high output.

Further, because the ZnFe lens M3 condenses laser beams, thus condensing them efficiently in a region of wavelengths 8–15 $\mu$m thereof. Furthermore, because the XY robot M6 moves the ZnFe lens M3 to control its focal point, the tape bonding/cutting apparatus can be manufactured at a cost lower than a tape bonding/cutting apparatus of mirror type.

The tape bonding/feeding device R comprises a tape bobbin R7; separation rollers R201 and R202; a separator-winding bobbin R8; a tape-bonding roller R9; a tape-stretching roller R101; a tape-removing roller R102; and a waste tape-winding bobbin-R5.

(2) Operation of tape-bonding/cutting apparatus

As shown in FIG. 2, a protection separator-provided tape T15 comprising a bonding tape T17 and a protection separator T16 is wound around the tape bobbin R7. The protection separator-provided tape 15 is unrolled from the tape bobbin R7 and separated into the bonding tape T17 and the protection separator T16 at the separation rollers R201 and R202. Then, the protection separator T16 is wound around a separator-winding bobbin R8.

The bonding tape T17 is stretched over a wafer-supporting work table P12 by the tape-bonding roller R9 and the separation roller R201. As shown by broken lines in FIG. 2, the wafer-supporting work table P12 having a wafer W14 fixedly sucked thereto moves upward toward the bonding tape T17.

As shown by broken lines in FIGS. 1 and 2, the tape-bonding roller R9 moves on the bonding tape T17 toward the separation roller R201, with the bonding tape T17 being pressed against the wafer W14 fixed to the wafer-supporting work table P12. In this manner, the bonding tape T17 is bonded to the wafer W14.

Then, the bonding tape T17 bonded to the wafer W14 is cut along the periphery of the wafer 14 by the cutting device M.

Thereafter, as shown by broken lines in FIGS. 1 and 2, the tape-removing roller R102 moves to the tape-bonding roller R9, thus lifting a waste tape T172 cut off from a tape 171 bonded to the wafer W14 to a point a certain distance above the wafer-supporting work table P12. At this time, the tape T171 bonded to the wafer W14 and cut off from the waste tape T172 by the cutting device M is left on the wafer W14.

Then, the wafer-supporting work table P12 having the wafer W14 fixed thereto in vacuum moves downward to remove the tape-bonded wafer W14 therefrom. Then, a new wafer W14 is fixedly sucked to the wafer-supporting work table P12 in vacuum, while the tape-removing roller R102 and the tape-bonding roller R9 return to the original position, respectively.

Then, the waste tape T172 is wound around the waste tape-winding bobbin R5, and a new bonding tape T171 is stretched over the wafer-supporting work table P12 by the tape-bonding roller R9 and the separation roller R201. These operations are repeatedly performed.

(3) Effect of tape bonding/cutting apparatus of first embodiment

Because the tape bonding/cutting apparatus of the first embodiment has the tape cutting device M which cuts the tape T17 by irradiating the masking sheet with the laser beam emitted by the $CO_2$ laser without contact between the silicon wafer W14 and a cutting blade or the like.

Because the laser beam emitted by the $CO_2$ laser is traveled through the optical fiber comprising silver halide, the generation of splash can be prevented.

Further, the CCD camera M4 recognizes the focal point of laser beams and the position of the wafer W14, thus controlling the focal point of the laser beams. Thus, the tape-cutting position can be controlled without contact. Because an IC is not mounted on the silicon wafer W14 in a range of several millimeters from the periphery thereof, a positional error in the focal point of about one or two millimeters is allowable. Thus, the CCU camera M4 having the above-described function allows the masking sheet to be cut reliably.

In addition, after the masking sheet is cut completely by the laser beam along the periphery of the wafer, the tape-removing roller R102 lifts the waste tape T172, thus removing it from the wafer. Therefore, no waste tape is left on the wafer.

As described above, the tape bonding/cutting apparatus of the first embodiment cuts the tape without damaging the wafer regardless of the difference in the size of the wafer and the variation in the position of the positioning flat or cutouts formed in the periphery of the wafer or even though there are dimensional errors in the positioning flat or cutouts or there are broken and chipped portions present in the periphery of the wafer. Accordingly, the tape bonding/cutting apparatus provides a high-percent yield of the wafer.

Further, because dust or smoke is not generated, the cleanability of the work environment can he prevented from being deteriorated.

According to the method of the present invention, there is no possibility that the ends (whiskers) are left at the periphery of the masking sheet. Therefore, there is no possibility that the cutting blade or the like is brought into contact with the ends (whiskers) in lapping and back surface-grinding processes to be performed subsequently to the bonding/cutting operation.

In addition, because the tape bonding/cutting apparatus automates the operation of bonding and cutting the masking sheet and the operation of removing a waste portion of the masking sheet from the wafer, personal expenses can be reduced and these operations can be accomplished at a high speed.

(Second Embodiment)

The method of cutting a masking sheet according a second embodiment of the present invention is described below with reference to FIGS. 3 and 4.

(1) Construction of bonding/cutting apparatus

Figure 3:
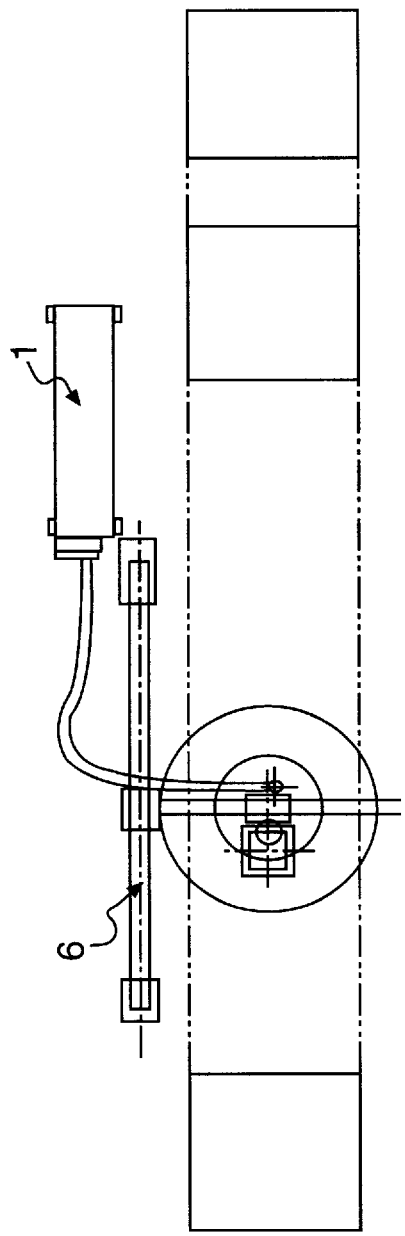
FIG. 3 is a plan view showing a masking sheet-bonding/cutting apparatus.
Figure 4:
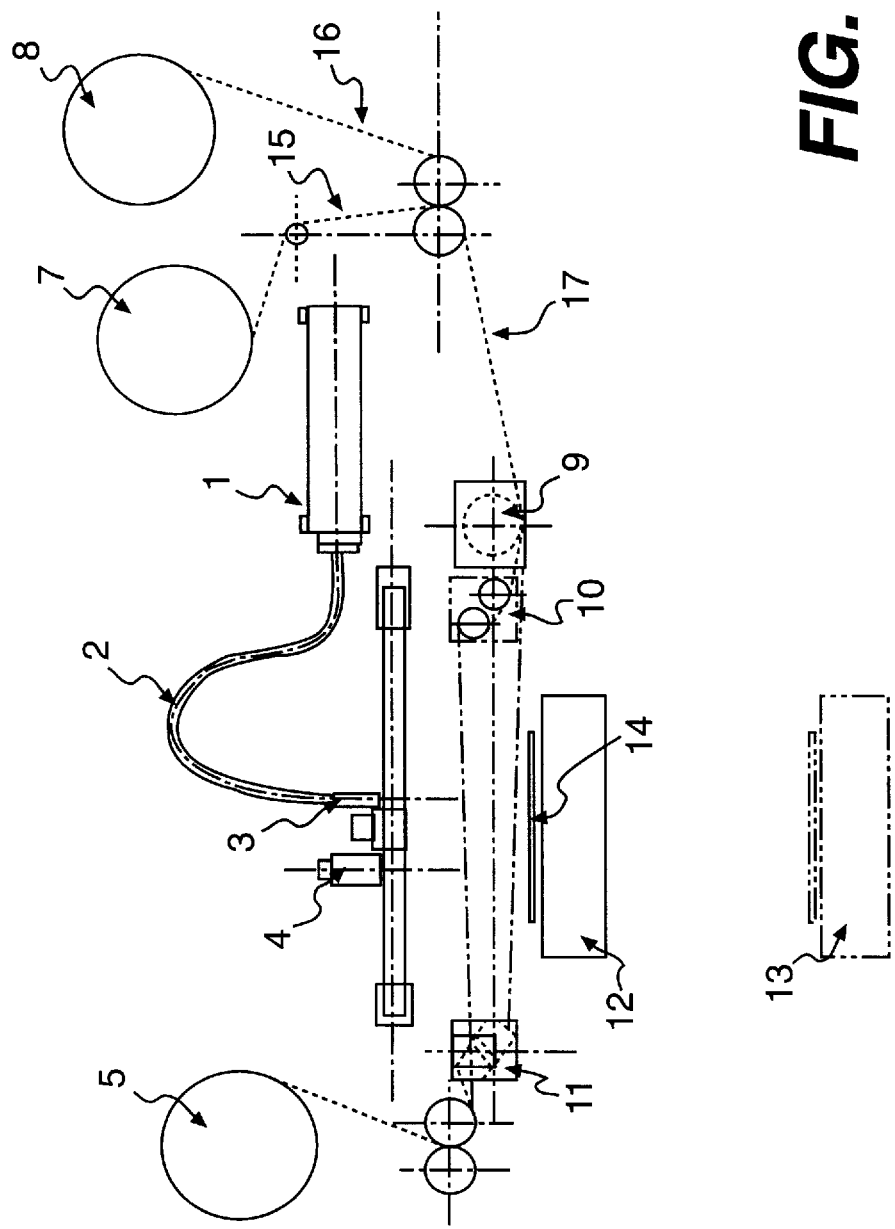
FIG. 4 is a side view showing a masking sheet-bonding/cutting apparatus.

FIGS. 3 and 4 show the construction of a bonding/cutting apparatus to carry out the method of the second embodiment. Reference numeral 1 denotes a mechanism for outputting a variable intensity and performing feedback of an output intensity and a $CO_2$ laser unit body. Reference numeral 2 denotes an FC grade optical fiber unit comprising silver halide. Reference numeral 3 denotes a ZnSe condenser lens of focal point-variable type. Reference numeral 4 denotes a CCD camera for detecting the size of each wafer and defects such as chipped portions. Reference numeral 5 denotes a waste tape-winding bobbin for winding thereon a waste tape cut off from a tape bonded to the wafer. Reference numeral 6 denotes an XY robot of equal speed continuous locus control type. Reference numeral 7 denotes a tape bobbin for winding thereon the tape provided with a protection separator. Reference numeral 8 denotes a protection separator-winding bobbin for winding thereon the protection separator removed from the tape. Reference numeral 9 denotes a tape-bonding roller.

Reference numeral 10 denotes a position at which both a roller for stretching the tape to be bonded to the wafer and a roller for removing the waste tape cut off from the tape bonded to the wafer from the wafer perform the operations thereof. Reference numeral 11 denotes a position at which both the roller for stretching the tape to be bonded to the wafer and the roller for removing the waste tape cut off from the tape bonded to the wafer from the wafer wait for starting the operation thereof. Reference numeral 12 denotes the upper position of a wafer (silicon substrate)-supporting work table. Reference numeral 13 denotes the lower position of the wafer-supporting work table. Reference numeral 14 denotes the position of the wafer which is placed on the wafer-supporting work table. Reference numeral 15 denotes the tape to which the protection separator has been attached. Reference numeral 16 denotes the protection separator separated from the tape. Reference numeral 17 denotes the tape from which the protection separator has been separated.

(2) Operation of bonding/cutting apparatus

The silicon substrate 14 is transported by the XY robot 6 to the upper surface of the wafer-supporting work table located at the lower position 13 and fixedly sucked thereto.

Then, the wafer-supporting work table moves upward to the position 12 so as to bond the tape 17 to the upper surface of the silicon substrate by the tape-bonding roller 9. The CCD camera 4 automatically picks up the image of the position and size of the silicon substrate and whether or not cutouts are present in the periphery thereof. Based on data provided by the CCD camera 4, the $CO_2$ laser beam irradiator cuts the tape 17 along the periphery of the silicon substrate.

The tape-removing roller located at position 11 automatically removes a waste tape from the silicon substrate. Then, the silicon substrate is returned to the lower position 13 and transported to a cassette by the handling apparatus of the XY robot 6 and so on.

In the above-described operation, the protection tape can be bonded to the silicon wafer and can be cut, and an unnecessary portion thereof, namely, the peripheral portion thereof can be removed from the silicon wafer without cracking or chipping the silicon wafer, without contact between a cutting blade or the like and the silicon wafer, even though the silicon wafer has defects at the periphery thereof or an unfavorable configuration. Accordingly, if it is necessary to process the silicon wafer again because of a demand for making the silicon wafer thinner or because the silicon wafer has not been processed at a high degree of accuracy or has defects, the protection tape can be bonded to the silicon wafer and can be cut, and the unnecessary portion thereof can be removed from the silicon wafer safely and many times.

Further, the laser beam, the center wavelength of which is 10 microns generated by the $CO_2$ laser beam oscillator 1 is dispersed in its intensity and spectrum by the FC grade optical fiber 2 and then condensed by the ZnSe lens 3. Consequently, the laser beam has an oscillation intensity in an elliptic configuration immediately after it is emitted by the laser beam oscillator 1. But the optical fiber comprising silver halide changes the intensity distribution and the spectrum distribution from the elliptic configuration into an ideal configuration. Thus, the splash does not occur and the cut surface of the masking sheet can be prevented from becoming defective because the localization of energy distribution does not take place in cutting the masking sheet and a favorable processing condition is provided, unlike the conventional apparatus.

Because the laser beam emitted by the $CO_2$ laser beam oscillator is invisible, it is necessary to handle it with much care. But the use of the optical fiber makes it possible to use the $CO_2$ laser beam oscillator as comparatively simple in construction and safe apparatus.

Although the present invention has been fully described in connection with the preferred embodiments thereof with reference to the accompanying drawings, it is to be noted that various changes and modifications can be made depending on purpose and use within the scope of the present invention.

For example, it is possible to bond each short masking sheet to the wafer.

What is claimed is:

1. A method of cutting a masking sheet to protect a silicon wafer comprising the steps of:

oscillating a laser beam by a laser beam oscillator;

feeding said laser beam to a nozzle through an optical fiber comprising silver halide wherein said optical fiber disperses the intensity distribution of the laser beam to prevent generation of splash otherwise caused by Q-switching the laser beam oscillator;

condensing said laser beam by a lens through said nozzle;

controlling the focal point of said condensed laser beam by a nozzle positioning means; and cutting said masking sheet along a periphery of said silicon wafer to remove an outer sheet portion of said masking sheet bonded to said silicon wafer.

2. The method as defined in claim 1, wherein said focal point of said condensed laser beam is controlled based on information provided by a CCD camera which recognizes a configuration of said silicon wafer and said focal point of said condensed laser beam.

3. The method of claim 1, wherein said laser beam is generated by a $CO_2$ laser and said optical fiber includes a quartz fiber.

4. The method of claim 3, wherein said optical fiber comprises a quartz core and Silver Halide cladding.

* * * * *